United States Patent [19]

Waldner et al.

[11] Patent Number: 5,566,840
[45] Date of Patent: Oct. 22, 1996

[54] DEVICE FOR ALIGNING PRINTED CIRCUIT BOARDS AND PATTERN CARRIERS

[75] Inventors: Paul R. Waldner, Bad Homberg; Bernd Gennat, Kelkheim, both of Germany

[73] Assignee: Multiline International Europa L.P., Germany

[21] Appl. No.: 337,118

[22] Filed: Nov. 10, 1994

[30] Foreign Application Priority Data

Nov. 12, 1993 [DE] Germany .......................... 43 38 656.3

[51] Int. Cl.⁶ ................................................. A47G 19/08
[52] U.S. Cl. .................... 211/41; 248/309.2; 361/735; 361/741; 361/790; 269/47; 269/903
[58] Field of Search .................... 211/41; 248/309.2; 361/735, 744, 741, 786, 790, 791, 806; 324/755, 760, 758, 73.1; 439/526, 892.2, 892.1; 269/903, 47, 52

[56] References Cited

U.S. PATENT DOCUMENTS

| | | | |
|---|---|---|---|
| 2,518,624 | 8/1950 | Kraft | 211/41 |
| 4,415,983 | 11/1983 | Lachman et al. | 361/741 |
| 4,463,310 | 7/1984 | Whitley | 324/758 |
| 4,935,695 | 6/1990 | Hayes et al. | 324/758 |
| 5,106,309 | 4/1992 | Matsuoka et al. | 439/526 |
| 5,241,454 | 8/1993 | Ameen et al. | 361/744 |
| 5,309,327 | 5/1994 | Slater | 361/744 |
| 5,418,688 | 5/1995 | Hertz et al. | 361/790 |
| 5,451,883 | 9/1995 | Staab | 324/758 |

FOREIGN PATENT DOCUMENTS

| | | | |
|---|---|---|---|
| 2437687 | 8/1974 | Germany | G03F 9/00 |
| 88 11 765.0 | 9/1988 | Germany | G03F 9/00 |
| 6-77620 | 3/1994 | Japan | 439/526 |
| 8607208 | 12/1986 | WIPO | 361/791 |

OTHER PUBLICATIONS

IBM Technical Disclosure Bulletin, vol. 20, No. 11A, Apr. 1978, "Chip–Module (Board) Package For High Speed Computer Technology" By N. Braslau.

Nepcon West, technical paper entitled "Registration Systems and Tooling For Multilayer Manufacturing", by Michael Angelo, 1981.

Primary Examiner—Alvin C. Chin-Shue
Assistant Examiner—Brian J. Hamilla
Attorney, Agent, or Firm—Larson and Taylor

[57] ABSTRACT

The device is used for the mutual alignment of perforated printed circuit boards and pattern carriers, for example films. It consists of a support (10) with parallel pins (16) axially slidable and laterally immovable within guides disposed thereon. In order to achieve a very exact alignment of the printed circuit boards and the films in spite of unavoidable tolerances regarding the position and the diameter of the centering bores cooperating with the pins (16), the pins are substantially polygonal in cross-section, having parallel lateral surfaces with either chamfered or rounded corners. The corners of the pins taper from the support (10) toward their free ends. They furthermore can be retracted into the support (10) using an actuator to prevent the tilting of the printed circuit boards in the course of their removal.

8 Claims, 3 Drawing Sheets

DEVICE FOR ALIGNING PRINTED CIRCUIT BOARDS AND PATTERN CARRIERS

FIELD OF THE INVENTION

The invention relates to a device for the mutual alignment of perforated printed circuit boards and pattern carriers, for example films, consisting of a support with parallel pins disposed thereon which are axially movably guided and which taper from the support towards the free end.

BACKGROUND OF THE INVENTION

In the course of manufacturing printed circuit boards, for example the outer boards of multi-layer printed circuit boards, it is necessary to bring respectively one printed circuit board, which is provided with a defined arrangement of holes, and a film representing a circuit (in manufacturing processes of photo lithography), screen frame (in manufacturing processes of serigraphy) or a different pattern carrier into a very defined relative position in order to place the pattern of the pattern carrier exactly over the hole pattern of the printed circuit board to be produced. For a long time a support supporting a plurality of parallel centering pins has been used for this purpose and the printed circuit boards and films were equipped with a number of centering holes whose arrangement coincided with the arrangement of the centering pins. The mutual orientation required for photo lithography or serigraphy was achieved by placing the centering holes of a printed circuit board and a film on the pins.

This production process no longer satisfies the requirements for accuracy. The reason for this are the unavoidable processing tolerances, in particular of the printed circuit boards. In the process, the tolerances which must be accepted in the course of drilling the centering holes are added to the tolerances in the layer thickness occurring in the course of galvanic coating of the bore hole walls. Because of the mentioned tolerances, the centering pins must have a correspondingly smaller cross section than the centering holes, with the result that many printed circuit boards are only loosely seated on the pins so that during exposure or printing the circuit image of the film or the screen frame is superimposed with a relative displacement on the hole pattern of the printed circuit boards.

The errors created in this manner are increased when the film or other pattern carriers are also seated with play or in a deformed way on the centering pins.

Devices are known from German Utility Model G 88 11 765.0 wherein the centering pins are axially movable and taper conically towards their free ends. Following application of the galvanized printed circuit board, the centering pins are pushed through the centering holes, which are narrowed because of the galvanizing process, with the aid of a pressure medium and then fixed in place. However, because of bores which were displaced because of production tolerances, this will result in deformations of the printed circuit board or even damage to the centering holes, which leads to unacceptable alignment errors.

Since centering of the printed circuit boards and the pattern carriers on pins suffered from inaccuracies which appeared to be unavoidable, optical devices have been developed lately which automatically bring the centering holes in the boards and centering dots on the film to coincidence by moving the boards in relation to the film. However, such devices are extraordinarily expensive in comparison with the pin frame, and the accuracy they can achieve is also limited by the production tolerances of the centering holes in the printed circuit boards.

OBJECT AND SUMMARY OF THE INVENTION

It is therefore the object of the invention to provide a simple device of the previously mentioned type which permits a considerably more accurate mutual alignment of the already perforated printed circuit boards being processed and of the pattern carrier than the devices with centering pins used up to now.

This object is attained by means of the invention in that the pins have a polygonal cross section with chamfered or rounded corners and lateral surfaces located plane-parallel to each other, wherein the chamfers or radii of the flattened corners increase from the support towards the free end, and that the pins are seated axially yielding in the raised position.

By means of the invention the advantage is achieved that, in spite of the tolerances in the position and the diameter of the centering holes in the boards which are to be taken into consideration, the pins can have a comparatively large cross section directly above the support on which the film and the printed circuit board to be produced are axially supported, which is only minimally less than the nominal cross section of the centering holes in their nominal positions. If now, because of production tolerances a centering hole has a position which deviates from the nominal position and/or a diameter which deviates from the specified size, the taper of the cross section of the pins toward their free ends always permits the placement of the printed circuit board with all its centering holes on the pins associated with them. In the process, a centering hole whose production tolerances are particularly large and/or added up, will already come to rest on one side of the associated pin during the placing process. Thanks to the further characteristic provided in accordance with the invention that the pins are seated so that they yield axially, it is possible to move the printed circuit board until it is supported on the support in a position aligned by the totality of the pins.

The recited shape of the pins has the advantage that the cross-sectional tapering towards the free ends is achieved by means of the converging chamfers or rounded edges alone, so that the lateral surfaces located plane-parallel opposite each other provide a lateral seating and guidance of the pin which is rigid on all sides, regardless whether one pin had to yield axially during placement of the board or not. Furthermore, with this pin shape the depression of one pin has no effects on the guidance of the film which is provided with elongated holes as centering holes in a known manner. In every axial position the plane-parallel oppositely located lateral surfaces of the pins offer broad guide surfaces at a constant spacing which is exactly matched to the width of the centering holes of the film, so that the depression of one pin by a board pushing with a bore hole side against a chamfer of the pin has no effects on the guidance of the film by two oppositely located lateral surfaces of this pin.

To be able to receive different board formats on the same pin arrangement, while at the same time achieving a high degree of alignment exactitude, it is provided in a preferred embodiment of the invention that in a top view the pins are located in two rows which abut at right angles against each other, and that more than two pins are respectively disposed in every row. For example, good results were achieved with a pin arrangement having five pins in one row and four pins in the other row, wherein one pin in the vertex of the right angle is common to both rows and wherein the lateral surfaces of the pins are suitably located parallel to the rows of pins.

In a further preferred embodiment of the invention, the pins have an essentially rectangular, preferably square cross section. The broad flanks provide assured guidance of the film even if one pin is partially pressed into the support because of a deviation in tolerance.

Preferably the invention is furthermore embodied in such a way that the pins are displaceable between positions which are advanced or retracted in relation to the support by means of an actuator. This suggestion offers the possibility of retracting the pins completely or partially into the support following the exposure or pattern transfer process before the printed circuit board is lifted off the pins. Tilting of the board on the pins during lifting, which would result in possible damage to the board or its coating, is avoided by means of this.

An exemplary embodiment of the invention will be described in detail below by means of the drawings.

DETAILED DESCRIPTION OF THE PREFERRED EMBODIMENT

Figure 1:
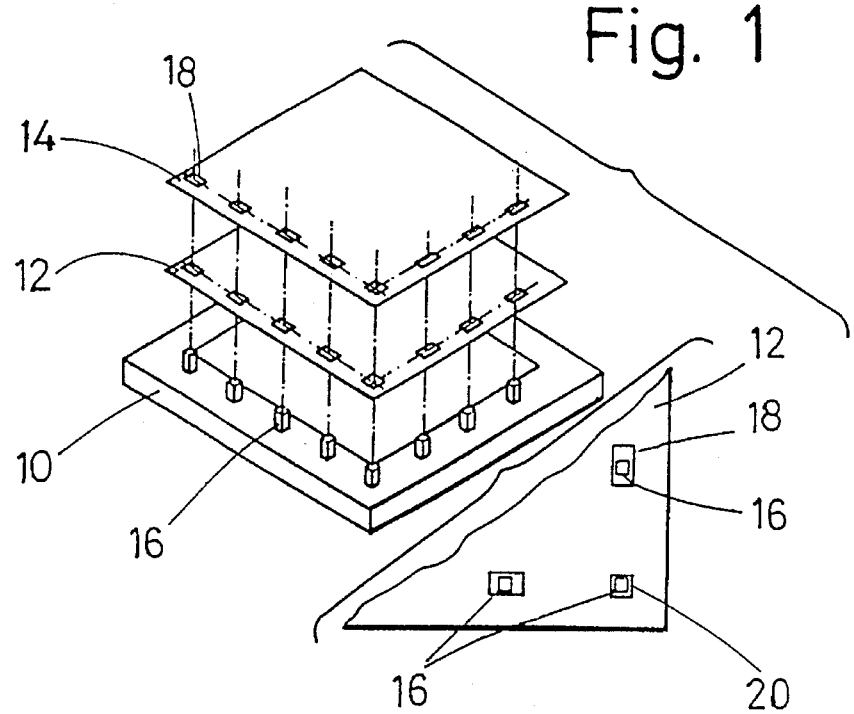
FIG. 1 is a perspective partial view of an exposure frame with centering pins attached thereon for printed circuit boards and films and an adjacent partial top view of the device and a film centered thereon.

The lower part 10 of a conventional glass frame, such as is used for the exposure of printed circuit boards for electronic circuits, is shown in FIG. 1. The other half of the glass frame, which cooperates with the half frame shown for clamping the printed circuit board to be exposed and the film having the image of a circuit, is not shown. A lower film 12 and an upper film 14 are represented in FIG. 1, between which a printed circuit board which is to be exposed on both sides and is not shown would have to be clamped. Only the lower film 12 is needed if it is intended to expose only one side of the board, such as in the case of an outer layer of a multiple-layered printed circuit board. The film is placed flat on the lower half 10 of the exposure frame used as the support, the board to be exposed is then placed on top of it and finally the upper, not shown half of the exposure frame is clamped over it.

In order to center the film 12 and the pre-drilled board to be placed on it in respect to each other, i.e. to align them in an exactly defined relative position in which the circuit image of the film is located exactly matched in respect to the hole pattern of the pre-drilled printed circuit board, the lower half 10 of the exposure frame used as a support is provided with a plurality of vertically upward extending centering pins 16. They are disposed in two rows which abut at right angles. In the exemplary case of FIGS. 1 and 2, the one row contains a total of five pins, inclusive of the pin disposed at the vertex of the right angle, while the the other row has a total of four pins, including the pin at the vertex.

All pins 16 have an essentially square cross section. The rectangular films 12 and 14 are respectively provided with a row of elongated holes 18 on two adjoining border edges, whose spacing and position corresponds to the distance and arrangement of the pins 16. The long edges of the elongated holes are oriented respectively parallel with the border edges of the film next to which the respective elongated hole is located. The width of the elongated holes 18 matches very exactly the width of the cross section of the pins, i.e. the distance between the lateral surfaces of the pins 16 which are respectively located plane-parallel opposite each other. A square hole 20 matching the square cross section of the pins 16 will be provided only at the vertex of the rows of holes in the film 12 or 14.

Figure 2:
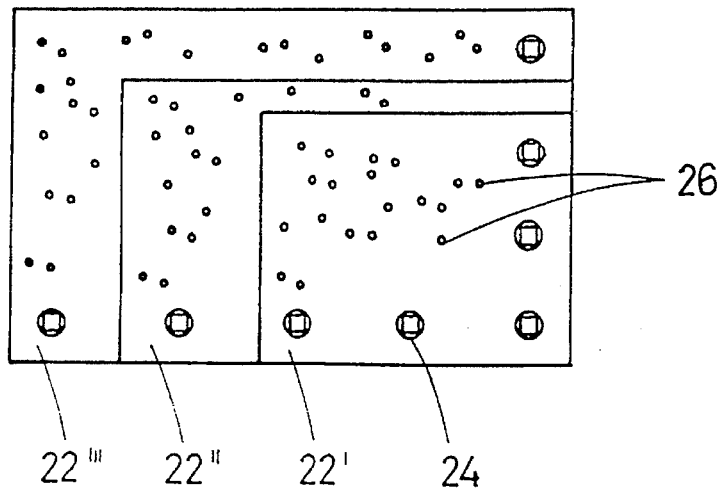
FIG. 2 is a top view of the device of FIG. 1 with printed circuit boards of different formats to be received therein represented on top of each other for simplicity's sake.

As can be seen in FIG. 2, the right-angled disposition of the rows of pins permits the reception of different board formats. In the case of the example, a small printed circuit board 22' is aligned by means of five pins 16. One pin more in one row is used for a slightly larger printed circuit board 22" and, if it is intended to expose the largest printed circuit board 22''' of the example, it is received on all eight pins 16.

In order to be able to place the printed circuit boards, generally indicated by 22, of different formats with exact alignment on the pins 16, they are provided with centering holes 24, whose arrangement and spacing corresponds to the arrangement and distance between the pins 16. The centering holes 24 are drilled, round holes. They can be drilled simultaneously with the holes indicated by 26, which are used for circuit purposes.

In the case of the example, the centering holes 24 have been drilled with a 4 mm drill. Following the galvanic coating of the boards, which takes place prior to exposure, the centering holes 24 have a diameter of approximately 3.955 to 3.985 mm. A tolerance of the position or the exactness of drilling of ±40 µm must additionally be taken into consideration. Under these circumstances the diameter of round centering pins should hardly be more than 3.87 mm, if the boards 22 are to be placed exactly in all cases. On the other hand, many boards would be seated with play on pins of such small diameter, so that the exact alignment with the films 12, 14 would not be assured.

Figure 4:
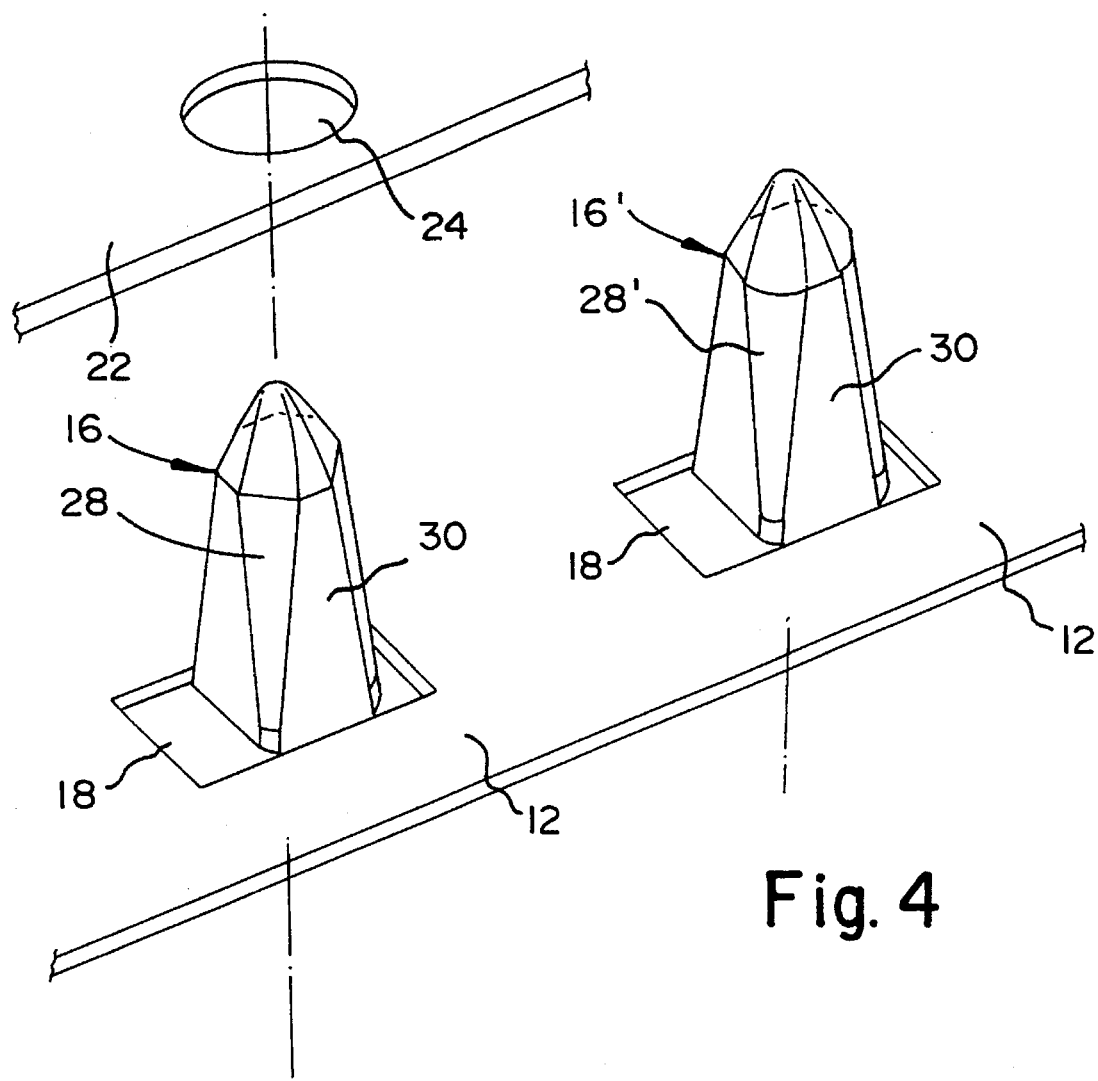
FIG. 4 is a perspective representation of pins of the type which may be used in the device of FIGS. 1 and 2 in an enlarged scale.

It is therefore proposed that the pins 16 taper from the support 10 in the direction of their free ends and are seated axially yielding on the support 10. With a basically constant square cross section, the taper over the height of the pins 16 is achieved in that its longitudinal edges are increasingly more chamfered toward the free end. The pin 16 on the left in FIG. 4 clearly shows one of the four chamfers 28 which widens increasingly toward the top, which could also be replaced by shoulders 28', as shown in the pin 16' on the right, with increasingly greater radii toward the top. Aside from this peculiarity of the chamfers widening toward the top or the increasingly larger shoulders, the pin basically has the shape of a cube or a prism with a square base, i.e. the two lateral surfaces 30 which are located respectively opposite each other are plane-parallel. The upper end of the pins 16 is sharpened or crowned, as can be seen in FIGS. 4 and 5, in order to ease insertion into the centering holes of the boards 22.

Figure 3:
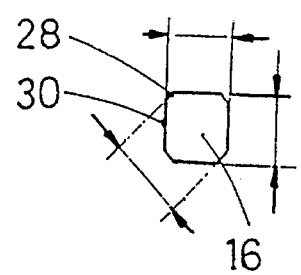
FIG. 3 is a cross section through the pin shown on the left in FIG. 4.
Figure 6:
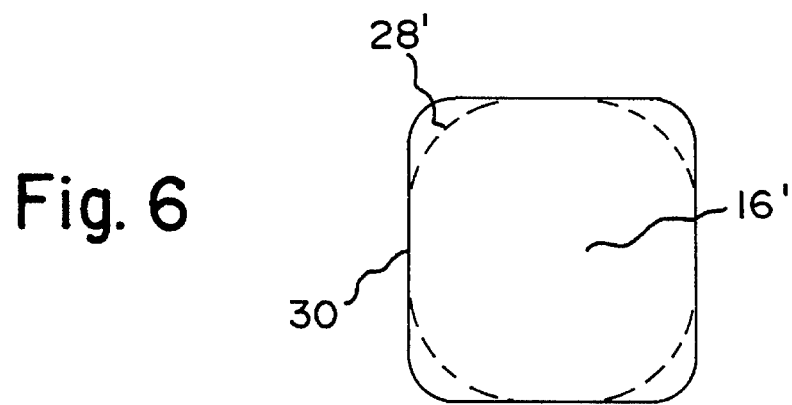
FIG. 6 is a cross section through the pin shown on the right in FIG. 4.

Because of the upward converging faces of the chamfers 28 or because of the diagonal measurement of the pin decreasing toward the top, the pin 16 can also enter those centering holes 24 which another pin, having a cross section which is constant over the height and having the same transverse dimension as at the lower end of the pins 16, could not enter because of the inexact position and the comparatively small diameter of the centering hole. In the case of the example, the square cross section of the pins 16 of FIG. 3 on pin 16' of FIG. 6 has an edge with a length of 3 mm. The diagonal measurement at the lower end of the pin is approximately 3.915 to 3.925 mm and decreases toward the top to approximately 3.84 mm because of the increasingly larger chamfers 28. In the exemplary embodiment the length of the pins is 8.5 mm.

Matching the measurements of the pins 16 mentioned, the elongated holes 18 in the film 12 or 14 have a width of 3.01 mm. Their length can be 5 mm, for example.

Figure 5:
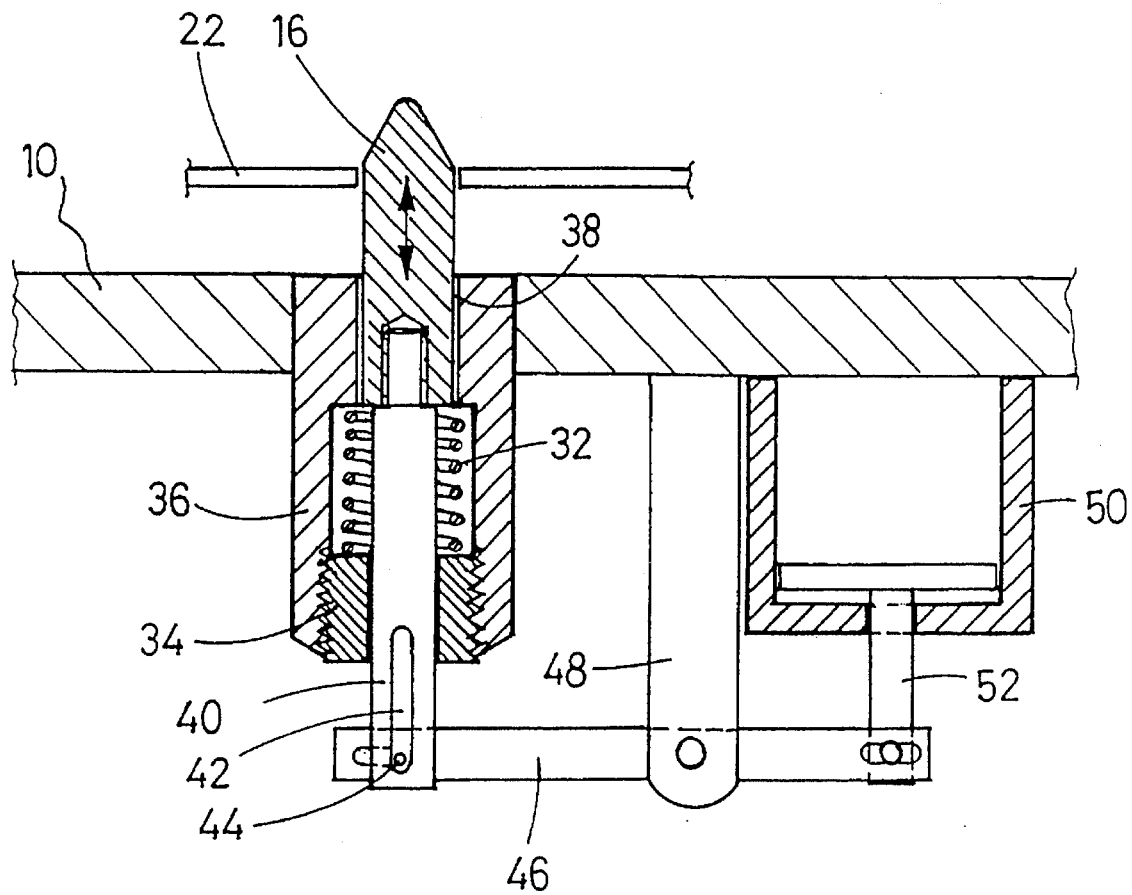
FIG. 5 is an axial cross section through one of the pins of the device of FIGS. 1 and 2, as well as its seating and actuator.

The longitudinal section through a pin 16 in accordance with FIG. 5 shows that it is seated axially yielding against the force of a pressure spring 32 on the lower half of the exposure frame 10 used as a support. The spring 32 is clamped between the underside of the pin 16 and a bush 34 which is screwed with an exterior thread into the interior thread of a bearing 36. The spring 32 exerts a force of approximately 4 to 10 N on the pin 16.

The bearing 36 is fastened on the exposure frame 10 and is provided in the upper area with a hole 38 which is square in cross section and whose wall rests exactly matched against the lateral surfaces of the pin 16, forming a lateral guide for it. Thus the pin 16 is only axially displaceable and laterally is exactly guided in the bearing 36.

The pin 16 is fixedly connected with an actuation rod 40 extending vertically downward through a central bore in the bush 34 and projecting downward out of it and the bearing 36. In the exemplary embodiment it is provided there with an elongated slit or elongated hole 42 extending in the axial direction, which is engaged by a pivot pin 44. The latter is attached to a two-armed lever 46, which is rotatably seated on a holder 48 connected with the exposure frame 10 and can be pivoted by means of a cylinder-piston unit 50, also fastened on the exposure frame 10, via a piston rod 52 pivotably connected with the lever 46 in such a way that the pivot pin 44 pulls the pin 16 back downward via the actuation rod 40. In the state of the pin 16 where it is completely or partially retracted into the support, the exposed printed circuit board can be removed without tilting from the pins 16 and the support 10.

The elongated hole 42 or a functionally equivalent structure assures that in those positions of the cylinder-piston unit 50 in which the pin 16 takes up the upwardly extended position in accordance with FIG. 5, the pin can be resiliently pushed down against the force of the spring 32. The transverse movement of the pivot pin 44 in respect to the actuation rod 40, which is required for pivoting the lever 46, can be made possible by an appropriately selected width of the elongated hole 42 or, alternatively, provisions are made for the displaceablity of the pivot pin 44 in the long direction of the lever 46.

It is understood that the described exemplary embodiment permits many variations. For example, in place of a square cross section, the pins 16 can also have a rectangular or other polygonal cross section with a prismatic overall shape. In place of the cylinder-piston unit 50 shown by way of example, electrical drives or those operated manually, for example, can be considered for retracting the pins 16.

What is claimed is:

1. A device for mutually aligning perforated printed circuit boards and pattern carriers, said device comprising:

a support having guides therein; and pins disposed in said guides, each of said pins having parallel lateral surfaces along a length thereof and corners having a shape selected from chamfered and rounded corners, thereby forming a substantially polygonal-shaped cross-section, a distance between said parallel lateral surfaces matching a width of said guides such that said pins are axially movable within said guides and laterally immovable in said guides, said corners of said pins tapering from the support toward free ends thereof.

2. The device according to claim 1 wherein said pins comprise two rows forming a right angle.

3. The device according to claim 2 wherein said pins are disposed in said guides such that said parallel lateral surfaces are parallel to said rows.

4. The device according to claim 2 wherein each of said rows comprises at least three pins.

5. The device according to claim 1 wherein said pins have a substantially rectangular-shaped cross-section.

6. The device according to claim 1 wherein the free end of said pins is sharpened.

7. The device according to claim 1 wherein the pins axially yield against a force of a pressure spring.

8. The device according to claim 1 further comprising an actuator for advancing or retracting said pins in relation to said support.

\* \* \* \* \*